United States Patent
Soenen et al.

(10) Patent No.: US 10,158,372 B1
(45) Date of Patent: Dec. 18, 2018

(54) ANALOG TO DIGITAL CONVERTER

(71) Applicant: Taiwan Semiconductor Manufacturing Company, Ltd., Hsinchu (TW)

(72) Inventors: Eric Soenen, Austin, TX (US); Alan Roth, Leander, TX (US)

(73) Assignee: TAIWAN SEMICONDUCTOR MANUFCTURING COMPANY, LTD. (TW)

(*) Notice: Subject to any disclaimer, the term of this patent is extended or adjusted under 35 U.S.C. 154(b) by 0 days.

(21) Appl. No.: 15/628,025

(22) Filed: Jun. 20, 2017

(51) Int. Cl.
*H03M 1/00* (2006.01)
*H03M 1/44* (2006.01)
*H03M 1/12* (2006.01)
*H03M 1/20* (2006.01)
*H03M 1/34* (2006.01)
*G01R 27/26* (2006.01)

(52) U.S. Cl.
CPC ......... *H03M 1/442* (2013.01); *H03M 1/1245* (2013.01); *H03M 1/206* (2013.01); *H03M 1/34* (2013.01); *G01R 27/2605* (2013.01); *H03M 1/00* (2013.01); *H03M 1/12* (2013.01)

(58) Field of Classification Search
CPC ........ H03M 1/00; H03M 1/12; G01R 27/2605
USPC ......... 341/158, 155, 120, 126; 324/658, 678
See application file for complete search history.

(56) References Cited

U.S. PATENT DOCUMENTS

| | | | |
|---|---|---|---|
| 6,476,749 B1* | 11/2002 | Yeap | H03M 1/121 341/126 |
| 7,649,485 B1* | 1/2010 | Kaplan | H03M 1/121 341/155 |
| 8,022,714 B2* | 9/2011 | Bartling | G01R 27/2605 324/658 |
| 9,041,582 B2* | 5/2015 | Sugimoto | A61B 5/14532 341/155 |
| 2004/0227651 A1* | 11/2004 | Furuichi | G01K 1/028 341/120 |
| 2013/0044017 A1* | 2/2013 | Matsuzawa | H03M 1/165 341/136 |
| 2013/0169327 A1* | 7/2013 | Helio | H03L 7/06 327/156 |
| 2013/0208915 A1* | 8/2013 | Hammerschmidt | H04R 3/00 381/98 |

* cited by examiner

Primary Examiner — Joseph Lauture
(74) Attorney, Agent, or Firm — Merchant & Gould P.C.

(57) ABSTRACT

An analog-to-digital converter ("ADC") includes an analog voltage sampler having an energy storage device, such as a capacitive element, configured to charge based on an analog input voltage. A timer determines an elapsed time for the energy storage device to discharge to a predetermined value. The ADC outputs a digital value representing the analog input voltage based on the determined elapsed time.

17 Claims, 7 Drawing Sheets

US 10,158,372 B1

ANALOG TO DIGITAL CONVERTER

BACKGROUND

Analog-to-digital converters ("ADC" or "A/D") are used in a variety of applications in order to convert a detected analog signal into a digital signal. There are a variety of ADC architectures, such as pipelined, flash, Sigma-Delta, successive approximation register ("SAR"), etc.

For example, a flash ADC uses a linear voltage ladder with a comparator at each "rung" of the ladder to compare the input voltage to successive reference voltages. The reference ladders are constructed of a resistor network, and the outputs from the comparators provide the digital value. Thus, to do an N-bit conversion, a flash ADC requires $2^N$ comparators, which can result in an ADC that is too big and consumes too much power for some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
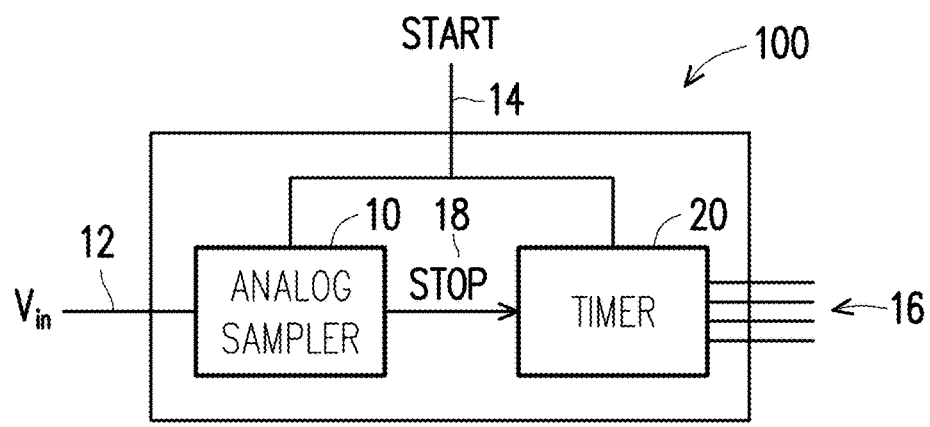
FIG. 1 is a block diagram illustrating aspects of an analog-to-digital converter ("ADC") system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Analog-to-digital converters ("ADC" or "A/D") convert an analog signal into a digital signal. Typical ADC arrangements, such as pipelined, flash, Sigma-Delta, successive approximation register ("SAR"), etc. are too slow for certain applications, and can use too much silicon area, consume too much power, and thus can be too expensive. A flash ADC uses a resistive linear voltage ladder with a comparator at each "rung" of the ladder. The comparators are configured to compare the input voltage to a plurality of successive reference voltages. Thus, to do an N-bit conversion, a flash ADC requires $2^N$ comparators, resulting in a large and power-hungry device. For example, known ADC arrangements can consume about 200 mW and take up about 0.5 mm$^2$ of chip space, which is too big for certain applications.

Many applications require converting a fast-varying analog signal to digital. For instance, certain radio frequency communications, radar, fast serial I/O, applications require fast, efficient and small ADC arrangements.

In accordance with examples disclosed herein, an ADC system samples an analog input using an energy storage device such as a capacitive element. A constant current source discharges the capacitive element. The higher the voltage level the capacitive element is charged to, the longer it takes to discharge—the discharge time is proportional to the input voltage level. Thus, measuring the discharge time and converting the measured time into digital counts results in a digital representation of the input voltage level.

FIG. 1 is a block diagram conceptually illustrating an example ADC system 100 in accordance with some embodiments of the present disclosure. An analog voltage sampler 10 receives an analog input voltage $V_{in}$ via an input terminal 12. The analog sampler 10 includes an energy storage device, which is charged to the input voltage $V_{in}$ level. In response to a START signal received via a start terminal 14, the energy storage device of the analog sampler 10 discharges. When the energy storage device discharges to a predetermined reference level, the analog sampler outputs a STOP signal 18.

A timer 20 also receives the START signal 14, and further receives the STOP signal 18 from the analog sampler 10. The timer 20 determines an elapsed time between receiving the START signal 14 and the STOP signal 18. In other words, the timer determines the time required for the energy storage device of the analog sampler 10 to discharge to the predetermined reference level. The timer 20 outputs a digital value 16 representing the analog input voltage $V_{in}$ based on the determined elapsed time.

Figure 2:
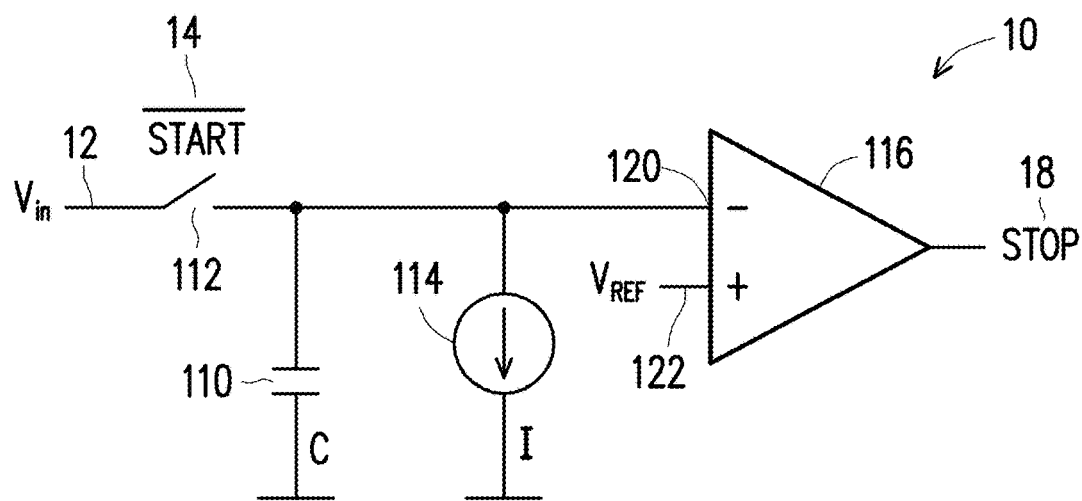
FIG. 2 is a circuit diagram illustrating aspects of an example ADC analog sampler in accordance with some embodiments.

FIG. 2 illustrates and example of the analog voltage sampler 10 in accordance with some embodiments. In the example shown in FIG. 2, the energy storage device includes a capacitive element 110 connected to the input terminal 14 via a switch 112 activated by the START signal 14. Thus, the capacitive element 110 receives the analog input voltage $V_{in}$ in response to the START signal 14. The capacitive element 110 is further connected to a discharge terminal to connect the capacitive element 110 to a constant current source 114, as well as a first input 120 of a comparator 116. A reference voltage $V_{ref}$ is connected to a second input 122 of the comparator 122. The comparator 116 outputs the STOP signal 18.

Thus, in the illustrated example, when the START signal 14 is low, the capacitive element 110 is charged to the $V_{in}$ level. When the START signal 14 is high, the capacitive element 110 is discharged by the current source 114 at a constant rate. When the capacitive element 110 reaches or goes below the reference voltage $V_{ref}$, the output of the comparator 116, or the STOP signal 18, goes high. The time elapsed between the START 14 and STOP signals going high reflects the analog input voltage $V_{in}$.

Figure 3:
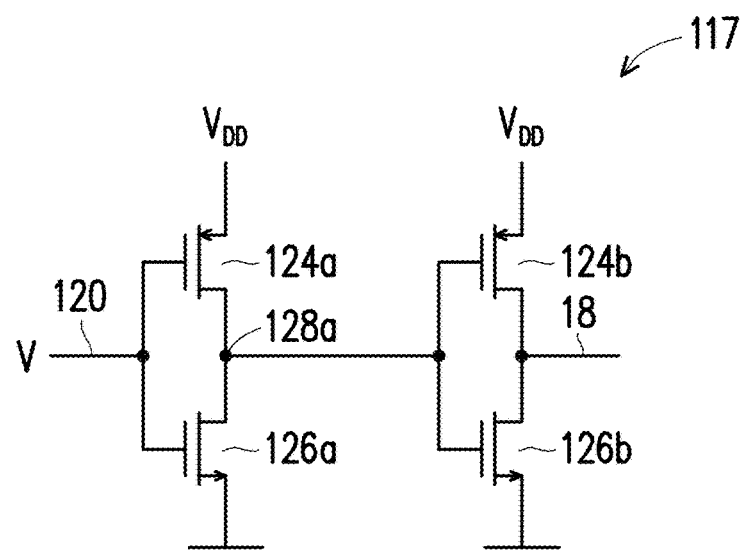
FIG. 3 is a circuit diagram illustrating aspects of an example comparator in accordance with some embodiments.

In some embodiments, the comparator 116 is implemented by a simple CMOS inverter structure with a known load threshold, rather than a traditional comparator with differential input pairs and associated circuitry. This makes the resulting ADC even smaller, further saving chip space. FIG. 3 illustrates an example of an inverter 117 that implements the comparator 116. The inverter 117 shown in FIG. 3 includes two PMOS transistors 124a, 124b and two NMOS transistors 126a, 126b. The gates of the first set of PMOS and NMOS devices 124a, 126a form the comparator input 120 and thus receive the discharge voltage of the capacitive element 110. The output 128a of the first set of PMOS and NMOS devices 124a, 126a is connected to the gates of the second set of PMOS and NMOS devices 124b, 126b, the output of which provides the STOP signal 18 in response to the discharge voltage at the comparator input 120 reaching a predetermined level. The predetermined voltage level can be effectively set by adjusting the logic switching threshold of the inverter 117. For example, the size of the NMOS device 124a can be adjusted to change relative strength of the N and P sides of the inverter 117, effectively adjusting the reference voltage ($V_{ref}$ in FIG. 2).

Figure 4:
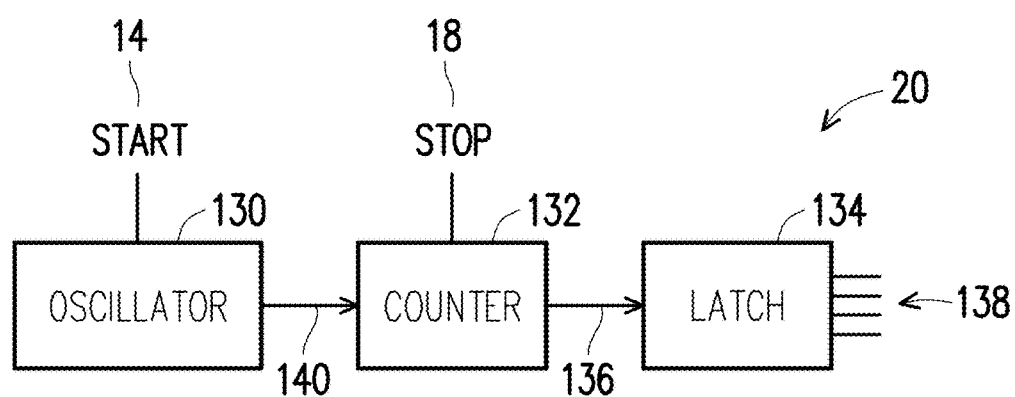
FIG. 4 is a block diagram illustrating aspects of an example ADC timer in accordance with some embodiments.

FIG. 4 illustrates additional aspects of the timer 20 shown in FIG. 1. In the example shown in FIG. 4, the timer 20 includes an oscillator 130, a counter 132, and a latch 134. The oscillator 130 and counter 132 function to measure the elapsed time between the START signal 14 going high and the STOP signal 18 going high; in other words, the discharge time of the capacitive element 110. Thus, the oscillator 130 is connected to the start terminal 14 to receive the START signal.

In the illustrated example, when the START signal 14 is high, the oscillator 130 produces a clock signal 140. In some embodiments, the oscillator 130 outputs a clock signal 140 having a frequency in the range of tens of GHz, for example 50 GHz. As noted above, the illustrated oscillator 130 outputs the clock signal 140 when the received START signal 14 is high, and is held when the START signal 14 is low. Thus, the oscillator 130 operates in response to the received START signal 14, which conserves power. In other implementations, the oscillator 130 operates continuously.

The counter 132 receives the clock signal 140 from the oscillator 130. Each clock pulse output by the oscillator 130 increments the counter 132, which thus determines the elapsed time until receipt of the STOP signal 18 output by the voltage sampler 10 and outputs a count value 136 to the latch 134. In response to the STOP signal 18, the latch 134 latches the output from the counter 132, and outputs a digital representation 138 of the analog input voltage $V_{in}$.

Figure 5:
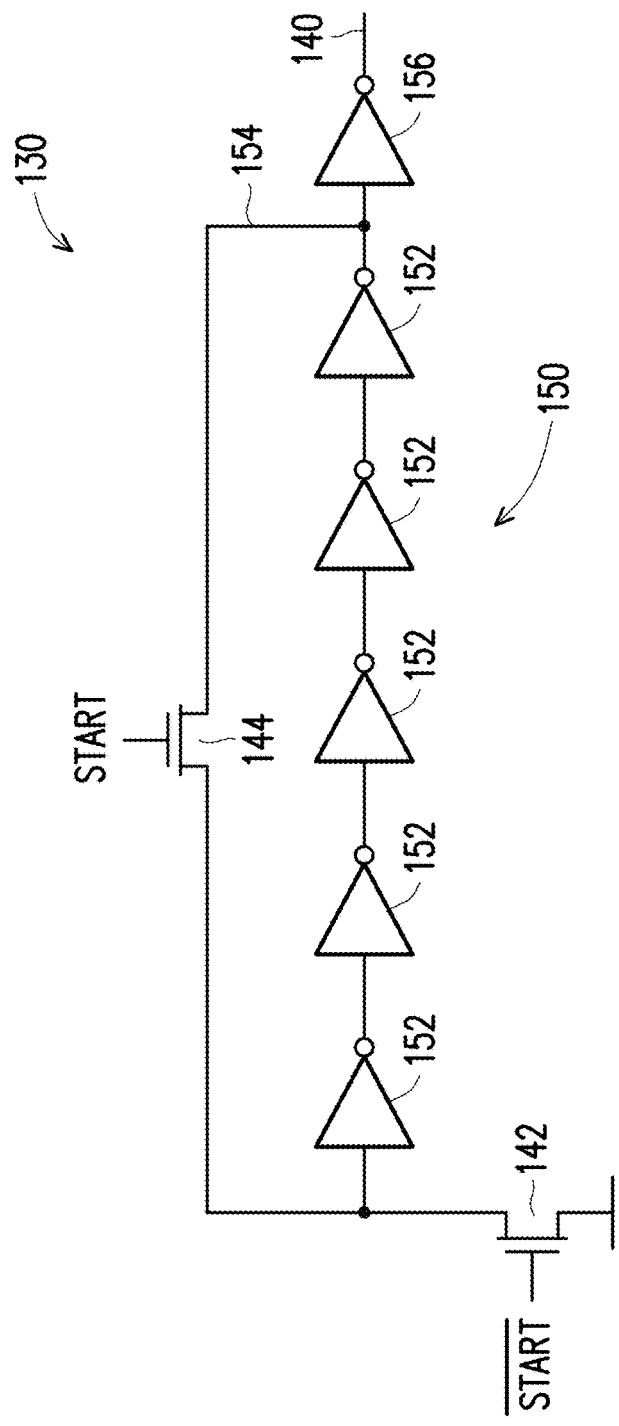
FIG. 5 is a circuit diagram illustrating aspects of an example oscillator in accordance with some embodiments.

FIG. 5 illustrates further aspects of the example oscillator 130 shown in FIG. 4. In some embodiments, the oscillator 130 comprises a ring oscillator, which provides a fast and small device. For example, the illustrated example oscillator 130 operates at a frequency greater than 10 GHz. In general, a ring oscillator is a time delay oscillator that includes a delay element between the output and input of the oscillator. In FIG. 5, the time delay element 150 includes a plurality of inverters 152 connected in series. In some embodiments, three or five inverters 140 are employed (the number of inverters is an odd number), and in the illustrated example, five inverters 152 make up the time delay element 150. The output 154 of the time delay element 150 is fed back to the first inverter 152 in the ring, and is also received by a buffer inverter 156, which provides the output 140 of the oscillator 130. The output of the oscillator 130 is bit 0 of the analog-to-digital conversion result.

In the illustrated example, when the START signal 14 is low, a first switch 142 turns on and the oscillator 130 is held, as noted above. In response to the START signal 14 going high, a second switch 144 turns on and the first switch 142 turns off, and the oscillator 130 runs to provide the clock signal output 140.

Figure 6:
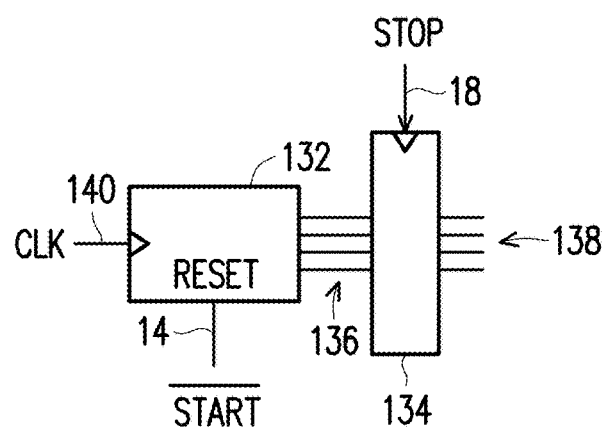
FIG. 6 is a circuit diagram illustrating aspects of an example ADC counter and latch in accordance with some embodiments.

FIG. 6 illustrates an example of the counter 132 and latch 134 for two bits of the digital output 138. The counter 132 receives the clock signal 140 from the oscillator 130, as well as the START signal 14. As noted above, the clock pulses 140 increment the counter 132, and the output 136 of the counter 132 is received by the latch 134. When the STOP signal goes high, the counter value 136 is latched, resulting in the digital output 138. When the START signal 14 goes low, the counter 132 is reset.

Figure 7:
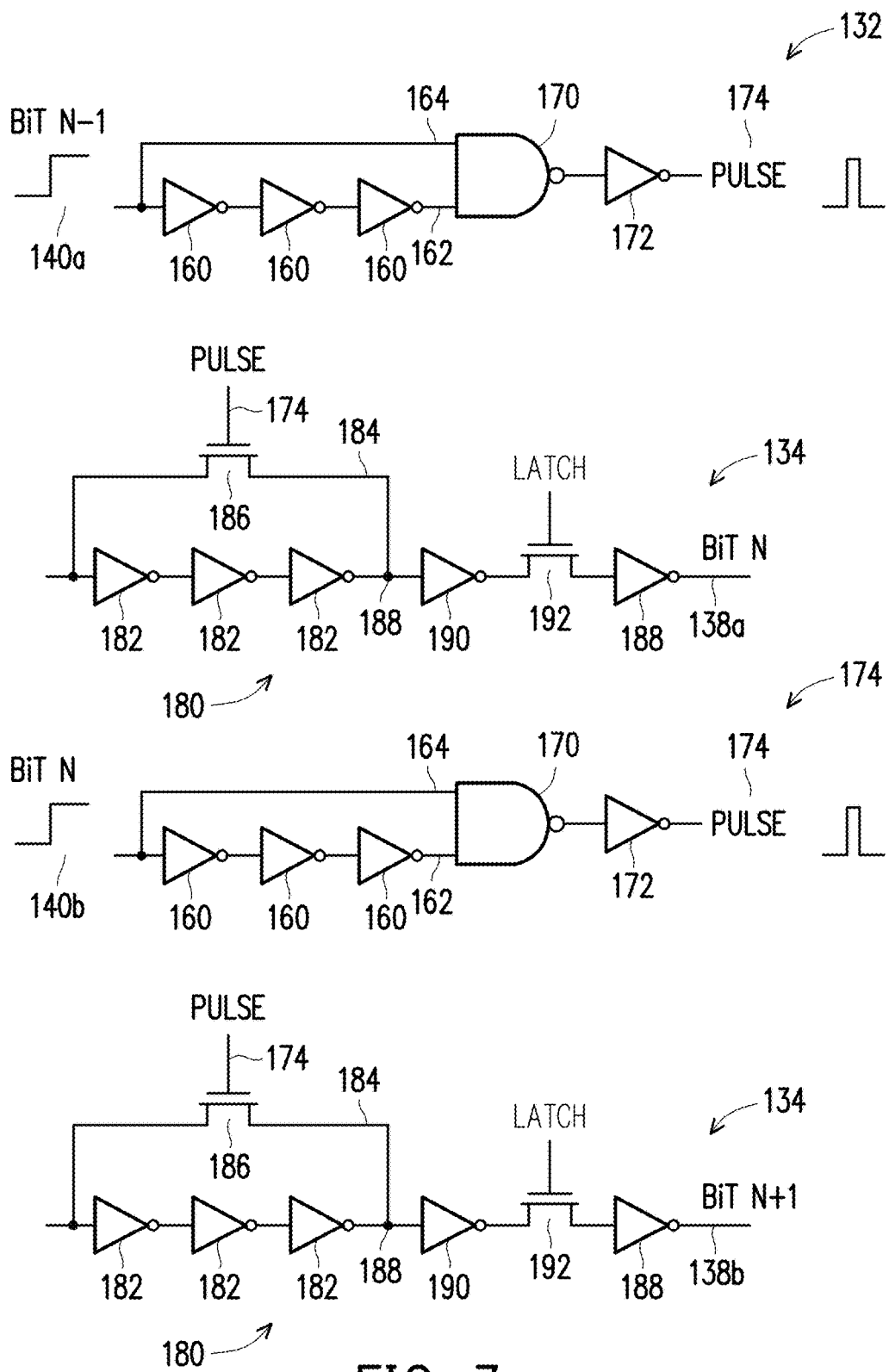
FIG. 7 is a circuit diagram illustrating further aspects of an example ADC counter and latch in accordance with some embodiments.

FIG. 7 illustrates an example of portions of an implementation of the counter 132 and latch 134. In FIG. 7, two bits (bit N and bit N+1) of the digital output 138a, 138b are illustrated, resulting from respective previous bits 140a, 140b (bit N−1 and bit N) received from the oscillator 130. As noted previously, the oscillator 130 provides a high frequency clock signal 140, which is greater than 10 GHz in some examples, thus requiring a fast counter. A plurality of inverters 160 are connected in series. In the illustrated example, three inverters 160 are connected in series, though in other embodiments other numbers of inverters 160 are provided, for example, five inverters.

The chain of inverters 160 receives one bit of the clock signal 140, and are connected to one input 162 of a NAND gate 170. The other input 164 of the NAND gate 170 is directly connected to the bit of the clock output 140, and the output of the NAND gate is received by an inverter 172 that provides a counter output pulse 174.

Examples of the latch 134 use dynamic "T" (toggle) flip-flops, which in FIG. 7, include a plurality of inverters 182 arranged in an inverter chain 180 with a feedback loop 184, which is provided via a feedback switch 186 operated by the pulse output 174 from a previous bit of the counter 132. When the output pulse 174 of the counter goes high, the feedback switch 186 is closed and the output 188 of the inverter chain 180 is fed back to the first inverter 182 of the inverter chain 180. The output 188 of the inverter chain 180 is also received by an output inverter 190, the output of which is provided to a latch inverter via a latch switch 192 that is operated in response to the STOP signal to provide the digital output 138. Thus, the digital output 138 is held until the START signal 14 is again initiated to start the next sampling cycle.

The output state is held dynamically by parasitic capacitance, thus for a relatively short time. Since the counter operates at a high frequency, the output 136 state is not required to be held for a long duration. Thus, each bit of the ADC output 138 is implemented in a simple and transistor-efficient manner.

Figure 8:
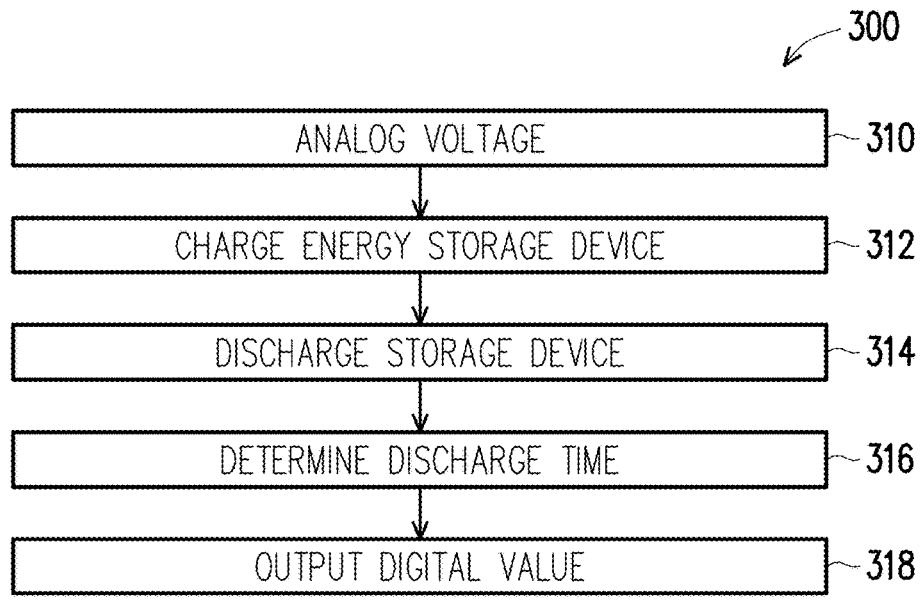
FIG. 8 is a process flow diagram illustrating an example of an ADC method in accordance with some embodiments.

FIG. 8 illustrates an ADC method 300 in accordance with further aspects of the disclosure. The process shown in FIG. 8 may be implemented, for example using the various structures disclosed herein. At an operation 310, an analog input voltage is received via the input terminal 12. The input voltage is sampled on an energy storage device, such as the capacitive element 110 shown in FIG. 2, and in operation 312 the energy storage device is charged by the received analog input voltage. In response to receiving the start signal 14, the energy storage device is discharged using the constant current source 114 in operation 314. In operation 316, the discharge time is determined, for example, using an oscillator and counter, such as the oscillator 130 and counter 132. The discharge time determined in operation 612 reflects the analog input voltage, and thus, in operation 318 a digital value corresponding to the analog input voltage based on the determined discharge time is output.

The analog-to-digital conversion speed can be further increased by time-interleaving a plurality of the ADCs disclosed herein. In other words, the analog input voltage is distributed and sampled among a plurality of ADCs operating in parallel. Thus, for a number N of ADCs connected in parallel with the analog input voltage distributed to the N ADCs and offset by one period divided by the number of ADCs N, the resulting analog-to digital conversion rate is the clock frequency for the individual ADC times the number of interleaved ADCs. Each ADC samples the analog voltage during a respective cycle of clock. Thus, the sample rate is greatly increased as compared to the individual ADCs.

Figure 9:
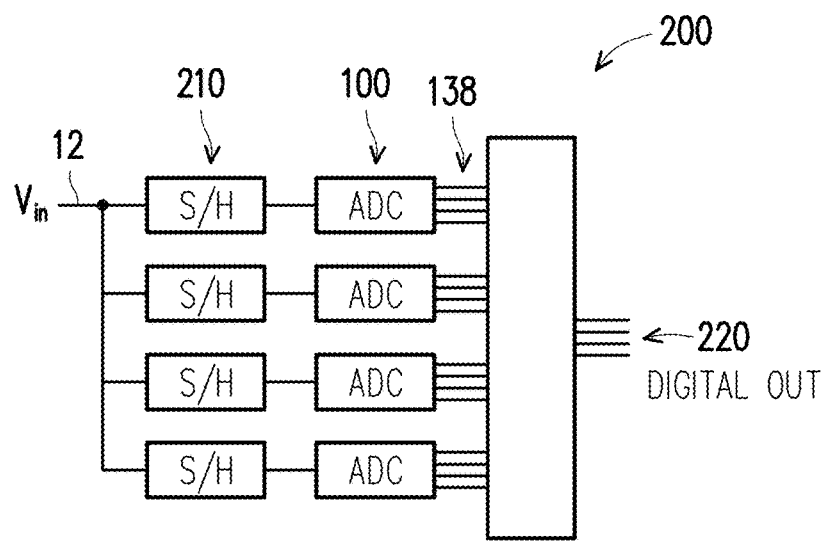
FIG. 9 is a circuit diagram illustrating aspects of an example interleaved ADC system in accordance with some embodiments.

FIG. 9 illustrates an example of an ADC system 200 in which a plurality of the ADCs 100 arranged in parallel. A plurality of corresponding sample and hold devices 210 are connected to the analog voltage input terminal 12 to receive the analog input voltage $V_{in}$ and distribute the input voltage $V_{in}$ among the ADCs 100. Each of the sample and hold devices 210 operate at the clock frequency, $f_{clk}$. Thus, the overall conversion speed of the ADC system 200 is $f_{clk}$ times the number of interleaved ADCs 100. The digital outputs 138 of each ADC 100 are combined to get a final output 220. For example, the individual digital outputs 138 are output in a time-interleaved fashion, such that each output 138 feeds the successive output, resulting in the final digital output 220.

Discrepancies among the individual ADCs, such as offset and/or gain errors, can result in noise that degrades the overall performance of the interleaved ADCs. Examples ADC systems disclosed herein include procedures for calibrating factors such gain and offset to avoid such noise when operating the interleaved ADC system 200. In general, a method for calibrating an ADC such as the ADC 100 disclosed herein includes applying a known analog input voltage to an input terminal of the ADC. The corresponding digital value output by the ADC is determined, and a difference between the known analog input voltage and the corresponding output digital value is determined. Referring to FIG. 2, the predetermined reference value 122 and the current source 114 may be adjusted response to the determined difference to adjust the system offset and gain, respectively.

Figure 10:
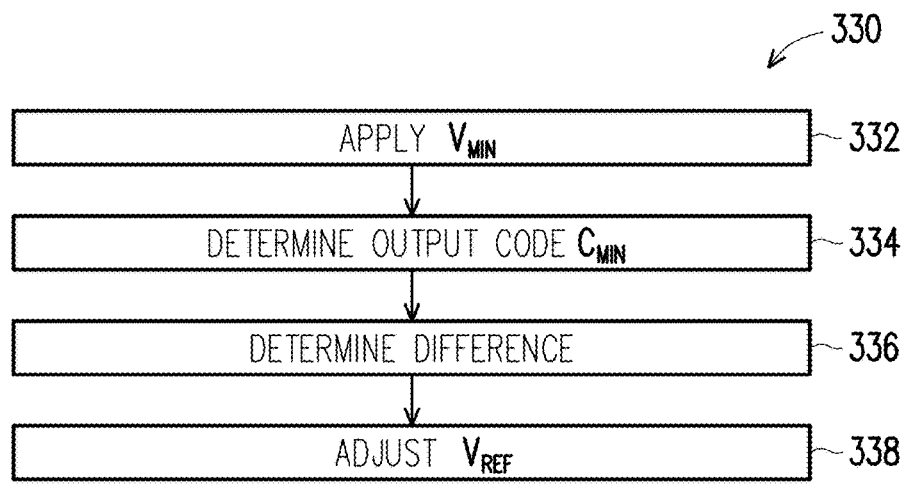
FIG. 10 is a process flow diagram illustrating an example of an ADC calibration method in accordance with some embodiments.

In some example processes, the offset is first adjusted, then the gain is adjusted. FIG. 10 illustrates an example of a calibration process 330. In general, offset can be calibrated by adjusting the $V_{ref}$ value. As noted above, for embodiments in which the comparator 116 is implemented using the inverter 117 illustrated in FIG. 3, the $V_{ref}$ value is effectively changed by adjusting the logic switching threshold of the inverter 117. At an operation 332, a known minimum voltage $V_{min}$ corresponding to the low end of the voltage range is applied. The $V_{min}$ level may be, for example, 0 volts. The resulting digital output should therefore be 0. In operation 334, the corresponding digital output, or digital code $C_{min}$ is observed, and in operation 336, the difference between the observed digital code $C_{min}$ and the expected code is determined. If the observed digital code $C_{min}$ differs from the expected code (i.e. 0), the offset is adjusted by changing the $V_{ref}$ value as indicated in operation 338 until the ADC outputs the correct code $C_{min}$ for the input voltage $V_{min}$. Adjusting the $V_{ref}$ value changes offset, but does not influence the gain of the ADCs 100.

Figure 11:
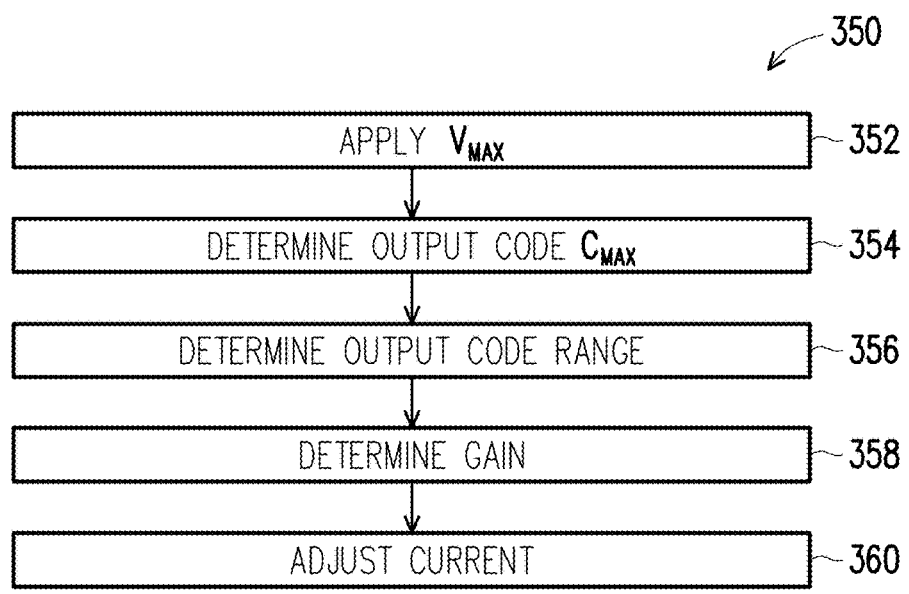
FIG. 11 is a process flow diagram illustrating another example of an ADC calibration method in accordance with some embodiments.

In some embodiments, the ADC gain is adjusted next. FIG. 11 illustrates an example a calibration process 350 for adjusting gain of the ADCs 100. Gain can be calibrated by adjusting the discharge current value I. At an operation 352, a known maximum voltage signal $V_{max}$ corresponding to the upper end of the input range is applied to the ADC 100, which outputs a corresponding maximum digital output, or digital code $C_{max}$. At operation 354, the corresponding output code $C_{max}$ is determined, and in operation 356, the difference between the maximum output code $C_{max}$ and the minimum output code $C_{min}$ is determined. By comparing the difference between $C_{max}$ and $C_{min}$ (output code range) to the difference between $V_{max}$ and $V_{min}$ (input voltage range), the gain (in codes per volt) is determined in operation 358. By adjusting the current (operation 360), the gain of the ADC can be increased or decreased until it reaches the expected value. With a higher discharge current I, the capacitive element 110 discharges faster, resulting in a smaller digital gain. If current is lower, the capacitive element discharges slower, resulting in a higher gain since it takes longer for the capacitive element 110 to discharge for the $V_{max}$ input voltage. In other words, the longer capacitive element discharge time results in more digital counts for same input voltage.

Accordingly, the various embodiments disclosed herein provide a compact, fast, and low power ADC system. For example, one ADC implementation employs 64 interleaved ADCs 100 running at 337.5 mega-samples per second (MS/s), resulting in 28 giga-samples per second (GS/s).

Thus, disclosed embodiments include an ADC that includes an analog voltage input terminal and a start terminal. An analog voltage sampler has an energy storage device, such as a capacitive element, connected to the input terminal. The analog voltage sampler is configured to charge based on an analog input voltage received at the analog voltage input terminal, and to discharge in response to a START signal received at the start terminal. The analog voltage sampler is further configured to output a STOP signal in response to the energy storage device discharging to a predetermined reference level. A timer is configured to receive the START signal and the STOP signal, to determine an elapsed time between receiving the START signal and the STOP signal, and to output a digital value representing the analog input voltage based on the determined elapsed time.

In accordance with further disclosed embodiments, an analog-to-digital conversion method includes receiving an analog input voltage, and charging an energy storage device by the analog input voltage. The energy storage device is then discharged, and a discharge time required for the energy storage device to discharge is determined. The determined discharge time is converted to a digital value, which is output to provide a digital representation of the analog input voltage.

In accordance with still further disclosed embodiments, a method of calibrating an ADC includes applying a known analog input voltage to an input terminal of an ADC. The ADC includes an analog voltage sampler having a capacitive element connected to receive the input analog input voltage and charge based thereon. A current source selectively discharges the capacitive element, such as in response to receiving a START signal. A timer is configured to determine a discharge time for the capacitive element to discharge to a predetermined voltage level, and output a digital value representing the analog input voltage based on the determined discharge time. The calibration method further includes determining the digital value output by the ADC, and determining a relationship between the known analog input voltage and the output digital value. In response to the determined relationship, at least one of the predetermined reference value and the current source are adjusted.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter ("ADC"), comprising:
   an analog voltage input terminal;
   a start terminal;
   an analog voltage sampler including an energy storage device connected to the analog voltage input terminal, the analog voltage sampler being configured to:
      directly sample an analog input voltage received at the analog voltage input terminal and charge the energy storage device to the level of the analog input voltage,
      discharge the energy storage device in response to a first signal received at the start terminal, and
      output a second signal in response to the energy storage device discharging to a predetermined reference level; and
   a timer configured to:
      receive the first signal and the second signal,
      determine an elapsed time between receiving the first signal and the second signal, and
      output a digital value representing the analog input voltage based on the determined elapsed time.

2. The ADC of claim 1, wherein the energy storage device comprises a capacitive element connected to receive the analog input voltage and charge to a level based on the received analog input voltage.

3. The ADC of claim 2, further comprising a discharge terminal configured to receive a constant current source for discharging the capacitive element in response to the first signal.

4. The ADC of claim 2, wherein the analog voltage sampler includes a comparator having a first input terminal configured to receive a discharge voltage from the capacitive element and a second input terminal configured to receive a reference voltage, the comparator configured to output the second signal in response to the discharge voltage reaching the reference voltage.

5. The ADC of claim 2, wherein the comparator comprises an inverter.

6. The ADC of claim 1, further comprising an oscillator configured to output a clock signal in response to receiving the first signal.

7. The ADC of claim 6, wherein the oscillator comprises a plurality of inverters connected in series.

8. The ADC of claim 6, wherein the timer includes a counter configured to receive the clock signal from the oscillator, and wherein the clock signal increments the counter until the second signal is output.

9. The ADC of claim 1, further comprising:
   a plurality of the ADCs connected in parallel;
   a plurality of sample and hold devices corresponding to the plurality of ADCs, the plurality of sample and hold devices being connected to the analog input voltage terminal and configured to distribute the received analog input voltage among the plurality of ADCs.

10. An analog-to-digital conversion ("ADC") method, comprising:
    receiving an analog input voltage;
    directly sampling the analog input voltage by an energy storage device, including charging the energy storage device by the analog input voltage to the level of the analog input voltage;
    receiving a first signal;
    discharging the energy storage device in response to the first signal;
    starting a timer in response to the first signal;
    receiving a second signal in response to the energy storage device discharging to a predetermined reference level;
    determining a discharge time required for the energy storage device to discharge based on the elapsed time between the first and second signals; and
    converting the determined discharge time to a digital voltage value.

11. The method of claim 10, wherein determining the discharge time includes starting an oscillator in response to receiving the first signal, wherein the oscillator outputs a clock signal.

12. The method of claim 10, wherein determining the discharge time includes outputting the clock signal to a counter, and wherein the clock signal increments the counter until the second signal is output.

13. The method of claim 10, wherein charging the energy storage device comprises charging a capacitive element with the analog input voltage, and wherein discharging the energy storage device comprises discharging the capacitive element with a constant current source.

14. The method of claim 10, further comprising distributing the analog input voltage among a plurality of energy storage devices that include the energy storage device.

15. A method of calibrating an analog-to-digital converter ("ADC"), comprising:
    applying a known minimum analog input voltage to an input terminal of an ADC, wherein the ADC comprises an analog voltage sampler including a capacitive element connected to receive the input analog input voltage and charge based thereon;

a current source for selectively discharging the capacitive element;

a timer configured to determine a discharge time for the capacitive element to discharge to a predetermined voltage level, and output a digital code representing the analog input voltage based on the determined discharge time;

determining a minimum digital code output by the ADC corresponding to the known minimum analog input voltage;

determining a difference between the minimum digital code output by the ADC and an expected minimum digital code; and adjusting the predetermined reference value in response to the determined difference.

16. The method of claim 15, further comprising:

determining an output code range;

determining an input voltage range;

comparing the output code range and the input voltage range; and adjusting the current source in response to the comparison.

17. The method of claim 16, further comprising:

applying a known maximum analog input voltage to the input terminal of the ADC, determining a maximum digital code output by the ADC corresponding to the known maximum analog input voltage;

wherein determining the output code range includes determining a difference between the maximum digital code and the minimum digital code; and wherein determining the input voltage range includes determining a difference between the maximum input voltage and the minimum input voltage.

* * * * *